(12) United States Patent
Ota et al.

(10) Patent No.: US 6,329,667 B1
(45) Date of Patent: Dec. 11, 2001

(54) NITRIDE SEMICONDUCTOR LIGHT EMITTING DEVICE AND MANUFACTURING METHOD THEREOF

(75) Inventors: Hiroyuki Ota; Mitsuru Nishitsuka; Hirokazu Takahashi, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/497,695

(22) Filed: Feb. 8, 2000

(30) Foreign Application Priority Data

Feb. 9, 1999  (JP) .................................................. 11-031122

(51) Int. Cl.$^7$ .................................................. H01L 29/06
(52) U.S. Cl. ................ 257/13; 257/22; 257/97; 257/103; 372/46
(58) Field of Search .................. 257/13, 14, 22, 257/85, 94, 96, 97, 103; 372/46

(56) References Cited

U.S. PATENT DOCUMENTS

| | | |
|---|---|---|
| 4,356,429 | 10/1982 | Tang . |
| 4,885,211 | 12/1989 | Tang et al. . |
| 5,047,687 | 9/1991 | VanSlyke . |
| 5,059,861 | 10/1991 | Littman et al. . |
| 5,073,446 | 12/1991 | Scozzafava et al. . |
| 5,224,115 | 6/1993 | Taylor et al. . |
| 5,285,086 * | 2/1994 | Fitzgerald, Jr. ........................ 257/85 |
| 5,294,870 | 3/1994 | Tang et al. . |
| 5,329,542 | 7/1994 | Westbrook . |
| 5,334,539 | 8/1994 | Shinar et al. . |
| 5,424,560 | 6/1995 | Norman et al. . |
| 5,721,160 | 2/1998 | Forrest et al. . |
| 5,727,015 | 3/1998 | Takahashi et al. . |
| 5,870,419 | 2/1999 | Nakayama . |
| 6,015,979 * | 1/2000 | Sugiura et al. ........................ 257/86 |
| 6,051,849 * | 4/2000 | Davis et al. ........................ 257/103 |
| 6,111,277 * | 8/2000 | Ikeda ..................................... 257/99 |
| 6,255,198 * | 7/2001 | Linthicum et al. .................. 438/481 |

* cited by examiner

Primary Examiner—Sara Crane
(74) Attorney, Agent, or Firm—Fish & Richardson P.C.

(57) ABSTRACT

A nitride semiconductor light emitting device having preferable light emitting characteristics even if dense threading dislocations extend through single crystal layers. The nitride semiconductor light emitting device includes an active layer obtained by depositing group-3 nitride semiconductors, and a barrier layer disposed adjacent to the active layer and having a greater bandgap than that of the active layer, the active layer having barrier portions which surround the threading dislocations and are defined by interfaces enclosing the threading dislocation and which are made of the same material as that of the barrier layer.

7 Claims, 8 Drawing Sheets

NITRIDE SEMICONDUCTOR LIGHT EMITTING DEVICE AND MANUFACTURING METHOD THEREOF

BACKGROUND OF THE INVENTION

1. Field of the Invention

The present invention relates to a group-3 nitride semiconductor device (referred to as device hereinbelow), and, in particular a nitride semiconductor light emitting device and a manufacturing method thereof.

2. Background Art

Extensive research is now underway on gallium nitride (referred to as GaN hereinbelow) and related compounds as a material system for a shortwave light emitting device, in particular, a shortwave semiconductor laser. A GaN-based semiconductor laser device is manufactured by successively depositing semiconductor single-crystal layers such as $(Al_xGa_{1-x})_{1-y}In_yN$ ($0 \leq x \leq 1$, $0 \leq y \leq 1$) on a crystal substrate.

A metal organic chemical vapor deposition method (abbreviated as MOCVD hereinbelow) is generally used to produce such a single-crystal layer. In this method, source gases containing trimethyl gallium (abbreviated as TMG hereinbelow) as a group-3 precursor material and ammonia ($NH_3$) as a group-5 precursor material are introduced into a reactor to react at a temperature within the range of 900–1000° C., thereby depositing compound crystals on the substrate. A multi-layer structure comprising various compounds can be obtained by changing the ratio of the precursors fed into the reactor to grow many different layers on the substrate.

If the deposited single-crystal layer has many penetrating defects, the light emitting performance of the device is deteriorated substantially. Such defect is called threading dislocation, which is a linearly extending defect that penetrates the crystal layer along the growth direction. Since a threading dislocation acts as a non-radiative recombination center for carriers, a semiconductor light emitting device comprising a layer with many dislocations suffers from poor luminous efficiency. The above mentioned defect is generated due to crystal misfit strain at an interface between the substrate and an overlying layer formed thereon. Attempts to reduce the effect of the misfit at the interface have been made by choosing substrate materials having similar crystal structure, lattice constant, and thermal expansion coefficient to those of GaN-based crystal.

A material, which meets the above requirements and has good compatibility with a substrate, is a semiconductor crystal itself. However, as for group-3 nitride semiconductors $(Al_xGa_{1-x})_{1-y}In_yN$ ($0 \leq x \leq 1$, $0 \leq y \leq 1$), it is inevitable to use dissimilar materials such as sapphire or the like, because there is no nitride semiconductor bulk crystal which is most suitable for a substrate. Sapphire has a lattice constant different from that of GaN by about 14%.

One approach, known as the two-step-growth method, was proposed to accommodate the misfit at the interface between a sapphire substrate and a Gan-based single-crystal layer grown thereon to reduce the generation of crystal defects in the GaN-based single-crystal layer. This method comprises the steps of forming a lower-temperature buffer layer consisting of aluminum nitride (AlN) on the sapphire substrate at a lower temperature within the range of 400–600° C., and then forming a GaN single-crystal layer over the lower-temperature buffer layer. However, the above method has not been completely successful in reducing the generation of such defects that pass through the GaN single-crystal layer.

Generally, as a dislocation in semiconductor crystals acts as a non-radiative recombination center and is substantially responsible for degrading the light emitting characteristics of light emitting devices such as light emitting diodes and semiconductor lasers, it is desirable that the crystals in these devices do not includes any dislocations. Therefore, research is now underway toward reduction of threading dislocations.

A main object of the invention is to provide a nitride semiconductor light emitting device having good luminescent characteristics.

Another object of the invention is to provide a method for manufacturing the above nitride semiconductor light emitting device whereby the generation of defects passing through a single-crystal layer formed on a substrate can be reduced.

SUMMARY OF THE INVENTION

The nitride semiconductor light emitting device according to the present invention comprises an active layer comprising group-3 nitride semiconductors, and a barrier layer made of a predetermined material and provided adjacent to the active layer. The barrier layer has a greater bandgap than that of the active layer. The light emitting device further comprises a barrier portion, or buried barrier portion defined by interfaces surrounding a threading dislocation in the active layer made of the same material as the barrier layer.

The nitride semiconductor light emitting device according to the present invention has a feature in that the active layer has one of a single and multiple quantum well structure.

The nitride semiconductor light emitting device according to the present invention has a feature in that the predetermined material of the barrier layer fills up a recess enclosed with the interfaces on the active layer to smooth surfaces of the recess.

The nitride semiconductor light emitting device according to the present invention has a feature in that the barrier portion has one of a cone-shape, truncated cone shape, and combination thereof.

The nitride semiconductor light emitting device according to the present invention has a feature in that the group-3 nitride semiconductor single-crystal layers are of $(Al_xGa_{1-x})_{1-y}In_yN$ ($0 \leq x \leq 1$, $0 \leq y \leq 1$).

The nitride semiconductor light emitting device according to the present invention further comprises a low temperature barrier layer provided between the barrier layer and the active layer, and that the low temperature barrier layer is formed of substantially the same predetermined material as that of the barrier layer at substantially the same temperature as the growth temperature of the active layer.

The nitride semiconductor light emitting device according to the present invention has a feature in that the low temperature barrier layer has a lower AlN composition ratio than that of the barrier layer.

According to the present invention, in order to provide a nitride semiconductor light emitting device comprising an active layer provided by depositing group-3 nitride semiconductor single-crystal layers $(Al_xGa_{1-x})_{1-y}In_yN$ ($0 \leq x \leq 1$, $0 \leq y \leq 1$) and a barrier layer provided adjacent to the active layer with a greater bandgap than that of the active layer, a method comprises the steps of forming a pit defining a recess attributable to a threading dislocation in semiconductor layers formed on a substrate in the active layer of group-3 nitride semiconductors, and depositing a material of the barrier layer onto the active layer to form a barrier portion surrounding the threading dislocation and having an interface defined by the side surface of the recess.

The method according to the present invention has a feature in that the step of forming the pit comprises a step of etching the active layer after the active layer is formed.

The method according to the present invention has a feature in that the etching in the step of etching is terminated when erosion along the threading dislocation partially reaches the underlying semiconductor layer.

The method according to the present invention has a feature in that the step of forming the pit comprises the step of forming the semiconductor layer at a temperature within a range of 600–850° C. prior to the growth of the active layer.

The method according to the present invention has a feature in that the method further comprises the step of forming a low temperature barrier layer of substantially the same material as that of the barrier layer at substantially the same temperature as a growth temperature of the active layer between the step of forming the pit and the step of depositing the material.

The method according to the present invention has a feature in that the low temperature barrier layer has a lower AlN composition ratio than that of the barrier layer.

According to the present invention, epitaxial growth of a wafer includes a step of forming pits in the active layer either by etching the wafer after the growth of the active layer is finished, or by growing a part of the guiding layer at lower temperature prior to the growth of the active layer. The epitaxial growth further includes a step of burying the pits which are defined by the interfaces surrounding the threading dislocations extending into the active layer, with a material having a wider bandgap than that of the active layer. Described above, the growth for a device wafer is completed.

According to the present invention, an barrier portion having a wider bandgap than that of an active layer surrounds a threading dislocation, thereby preventing the diffusion of carriers to the dislocation, so that a device has the improved light emitting characteristics.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

A group-3 nitride semiconductor laser device according to an embodiment of the present invention will be described below with reference to the drawings. A first embodiment of the present invention will be described hereinafter with respect to the case where a wafer in the course of growth is taken out from an epitaxial growth apparatus to be etched as described above.

Figure 1:
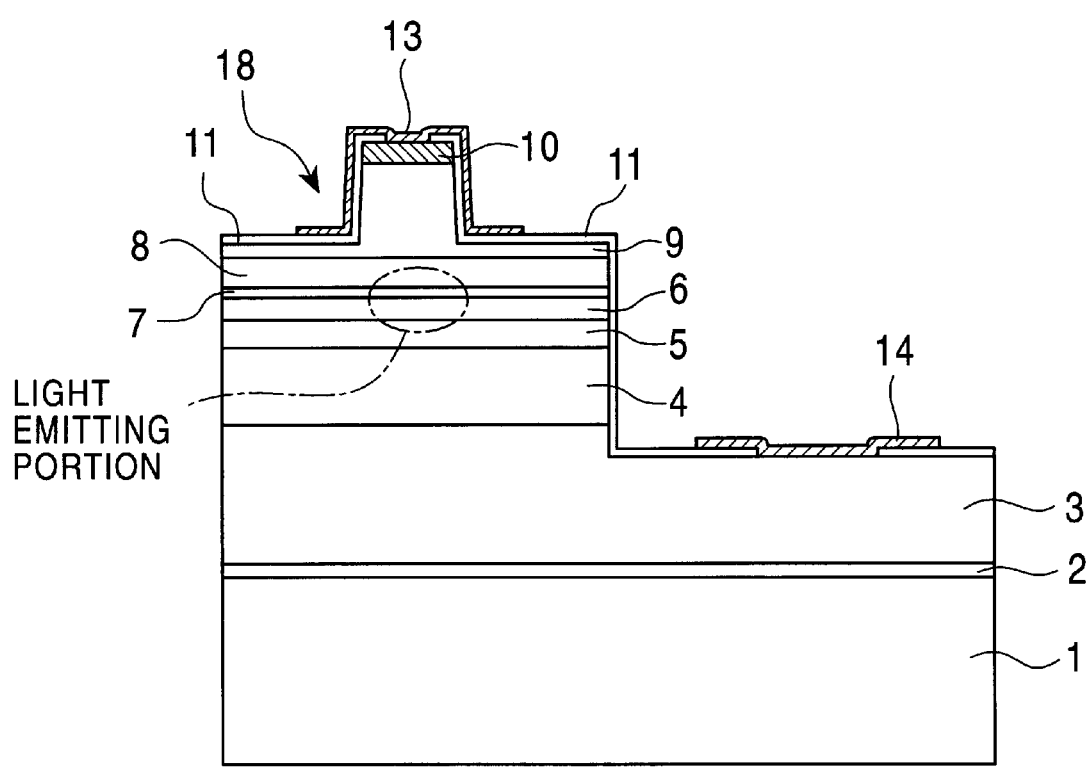
FIG. 1 is a schematic, cross sectional view showing a group (III) nitride semiconductor laser device according to the present invention.

FIG. 1 shows a group-3 nitride semiconductor laser device according to the embodiment. The semiconductor laser device comprises a GaN (or AlN) layer 2 formed at a lower temperature, an n-type GaN layer 3, an n-type $Al_{0.1}Ga_{0.9}N$ layer 4, an n-type GaN layer 5, an active layer 6 of multiple quantum well structure including InGaN as a main constituent, a p-type $Al_{0.2}Ga_{0.8}N$ layer 7, a p-type GaN layer 8, a p-type $Al_{0.1}Ga_{0.9}N$ layer 9, and a p-type GaN layer 10, which are deposited in the above order on a single crystal sapphire substrate 1. The semiconductor laser device further comprises an n-type electrode 14 connected to the n-type GaN layer 3 and a p-type electrode 13 connected to the p-type GaN layer 10. The p-type $Al_{0.1}Ga_{0.9}N$ layer 9 has a ridge stripe portion 18. The device is covered with an insulating film 11 of $SiO_2$ for protection except for the electrodes. In this manner, the nitride semiconductor laser device of the present embodiment comprises an active layer including a multi-layered structure formed by successively depositing group-3 nitride semiconductors.

The semiconductor laser device emits light through recombination of electrons and holes in the active layer 6. The n-type GaN layer 5 and p-type GaN layer 8 act as guide layers. The n-type GaN layer 5 and p-type GaN layer 8 serve to guide light generated in the active layer 6 to the guide layers 5, 8. The n-type GaN layer 5 and p-type GaN layer 8 also serve to trap electrons and holes into the active layer 6 effectively with the larger bandgap than that of the active layer 6. The p-type $Al_{0.2}Ga_{0.8}N$ layer 7 is a barrier layer for enhancing the confinement of injected carriers (in particular, electron). The n-type $Al_{0.1}Ga_{0.9}N$ layer 4 and the p-type $Al_{0.1}Ga_{0.9}N$ layer 9 are clad layers having lower refractive indexes than those of the guide layers 5, 8, so that differences in refractive indexes between the clad layers and the guide layers cause light to be guided in a film thickness direction. The ridge stripe portion 18 is provided in order to produce a step effective refractive index, by changing the thickness of the cladding layer 9 thereby confining the generated light laterally. The n-type GaN layer 3 is an underlying layer which allows a current to flow. The n-type GaN layer 3 is required because sapphire constituting the substrate does not have any conductivity. Additionally, the lower-temperature growth layer, or GaN (or AlN) layer 2 is a so-called buffer layer for producing a smooth layer on the sapphire substrate which is a substance dissimilar to GaN.

Figure 2:
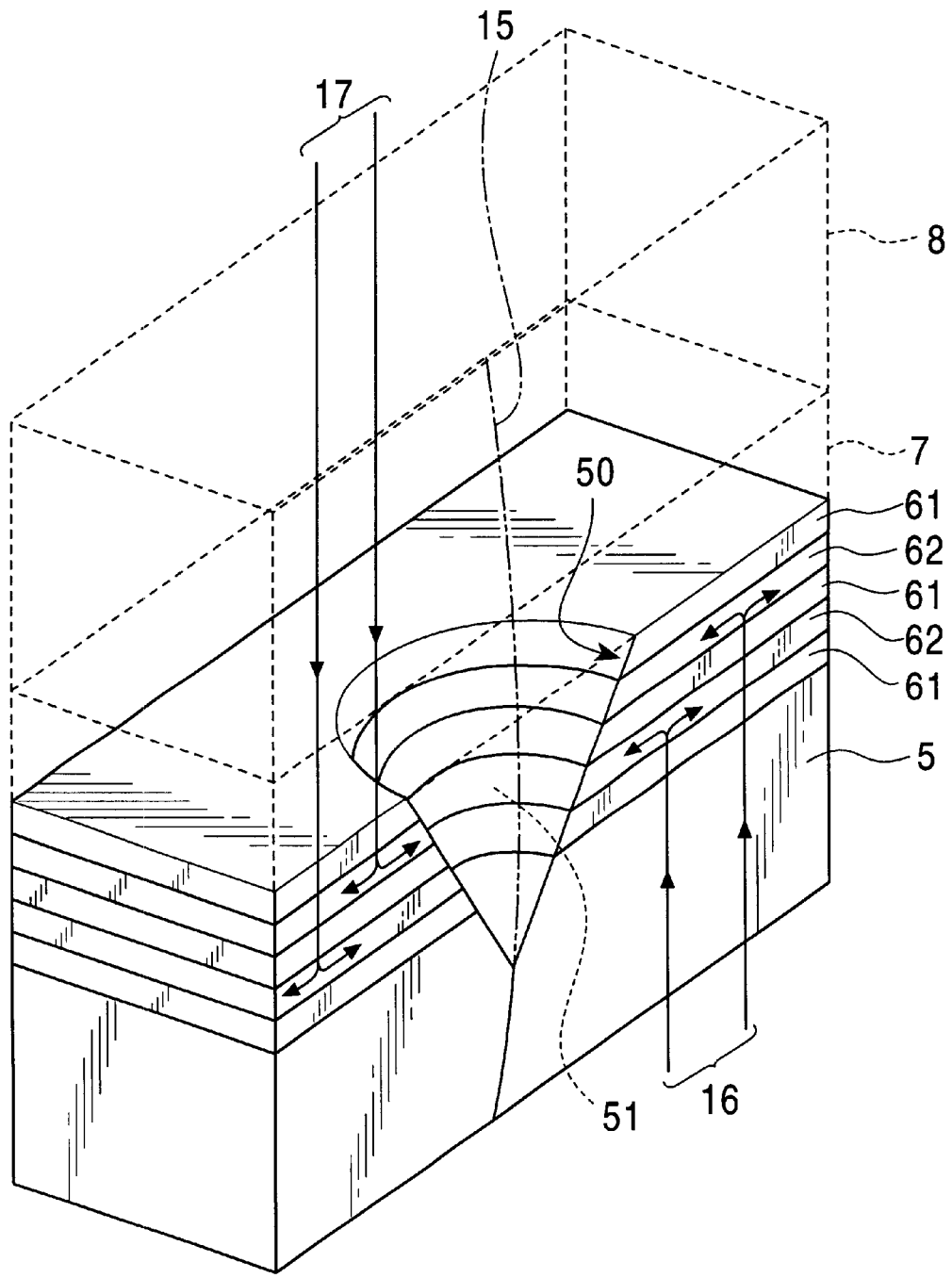
FIG. 2 is a schematically fragmentary, perspective view showing an active layer of the group (III) nitride semiconductor laser device according to the present invention.

Referring to FIG. 2, the above device further comprises a barrier portion 51 defined by an interface 50 of the active layer 6 and formed of the same material as that of the barrier layer 7. The interface 50 extends in the vicinity of a threading dislocation 15 extending from the lower guide layer 5 to the upper guide layer 8 through the active layer.

When current flows into the device, electrons 16 are injected from the n-type GaN layer 5 into the active layer 6 made of InGaN, as shown in FIG. 2. Since the active layer comprises the well layers 62 which have greater In composition ratio (that is, narrower bandgap), and the barrier layers 61 which have smaller In composition ratio (that is, wider bandgap), injected electrons are then collected by the well layers 62. Further, injected holes 17 from the p-type GaN guide layer 8 are also collected by well layers 62 for the same reason. In this case, being blocked by the AlGaN barrier portion 51, both of electrons 16 and holes 17 cannot reach the threading dislocation 15. This is because the the threading dislocation 15 is surrounded by the AlGaN barrier portion 51 having a larger bandgap as compared with that of the well layers 62, which is composed of InGaN with high In composition ratio. Thus, the barrier portion 51 prevents the injected carriers from reaching the threading dislocation 15, which usually acts as a non-radiative recombination, center the device has higher luminescence efficiency than that of one having no barrier portion 51.

The device having the structure shown in FIG. 1 will be manufactured in the following process in which a layer-structure of the laser device is formed on a sapphire A-face substrate by MOCVD.

First, a sapphire substrate 1 is loaded into a MOCVD reactor, and then placed in a hydrogen gas flow under a pressure of 300 Torr at a temperature of 1050° C. for ten minutes for thermal cleaning of the surface of the substrate. The sapphire substrate 1 is then cooled to a temperature of 600° C. Next, an ammonia $NH_3$ and trimethyl aluminum (abbreviated as TMA hereinbelow) as precursor materials are introduced to the reactor to grow AlN layer, thereby forming a buffer layer 2 having a thickness of 50 nm.

Next, after stopping the feed of TMA, the sapphire substrate 1 with the buffer layer 2 is again heated up to 1050° C. while only NH3 gas is flowing through the reactor. TMG is then introduced to the reactor to grow a n-type GaN underlying layer 3. During the above process, methylsilane (Me—$SiH_3$) as an n-type dopant is added to the precursor material gas.

At a point of time when the n-type GaN underlying layer 3 has been grown to a thickness of about 4 $\mu$m, only the feed of TMG is stopped. Meanwhile, methylsilane continues to be supplied with increased flow rate. After this process is maintained for 5 minutes, a feed of methylsilane is decreased to a valve required for formation of an n-type layer. TMG is then introduced again, while TMA is simultaneously introduced so that an n-type AlGaN clad layer 4 is formed.

At a point of time when the n-type AlGaN clad layer 4 has been grown to a thickness of about 0.5 $\mu$m, the feed of TMA is stopped, and an n-type GaN lower guide layer 5 is grown to a thickness of 0.1 $\mu$m.

At a point of time when growth of the n-type GaN guide layer 5 is completed, the feed of TMG and Me—$SiH_3$ is stopped, and the substrate starts to be cooled to a temperature of 750° C. At a point of time when the substrate temperature reaches 750° C., the carrier gas is switched over from hydrogen to nitrogen. At a point of time when the gas flow becomes stable, TMG, trimethylindium (TMI), and Me—$SiH_3$ are introduced to grow a barrier layer 61.

Subsequently, the feed of Me—$SiH_3$ is stopped and TMI is increased in flow rate so that the well layers 62 having a greater In composition ratio than that of the barrier layer is grown.

The growth of the barrier layer(s) 61 and the well layer(s) 62 is repeated in accordance with the number of wells in the multiple quantum well structure. Described above, an active layer 6 of the multiple quantum well structure is formed.

At a point of time when a barrier layer 61 is formed on the last well layer 62, the feed of TMG, TMI, and Me—$SiH_3$ is stopped. At the same time, the substrate starts to be cooled. At a point of time when the substrate temperature is equal to or lower than 400° C., the feed of $NH_3$ is also stopped. At a point of time when the substrate temperature becomes a room temperature, the substrate is unloaded from the reactor.

Figure 3:
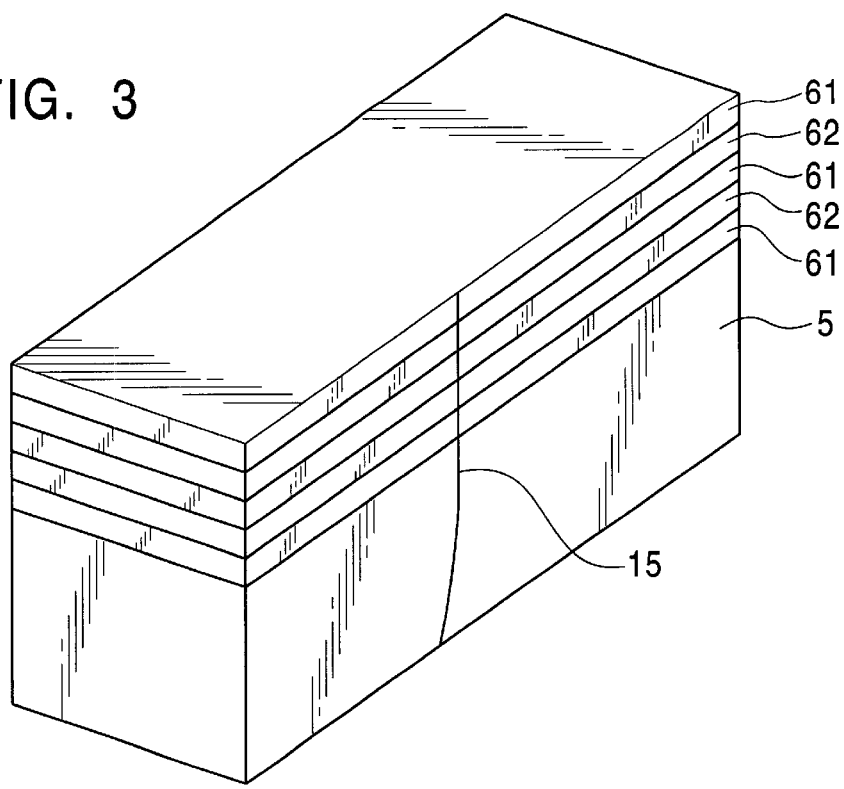
FIG. 3 is a schematically fragmentary, perspective view showing a substrate or wafer in the manufacturing process of semiconductor laser devices according to an embodiment of the present invention.

FIG. 3 shows a layer structure on the substrate which is unloaded from the reactor in the course of growth without growing of a p-type layer. It has been found that the layer structure includes a lot of threading dislocations 15, and that the layer structure of the above embodiment has a dislocation density on the order of 2E9 (1/cm$^2$) by means of a measurement.

The resultant substrate with the layer structure is then immersed in $H_3PO_4$ (phosphoric acid) solution heated at 200° C. to be etched. Thus, a recess or pit ascribable to the threading dislocation 15 in the lower guide layer 5 is formed in the active layer 6.

Figure 4:
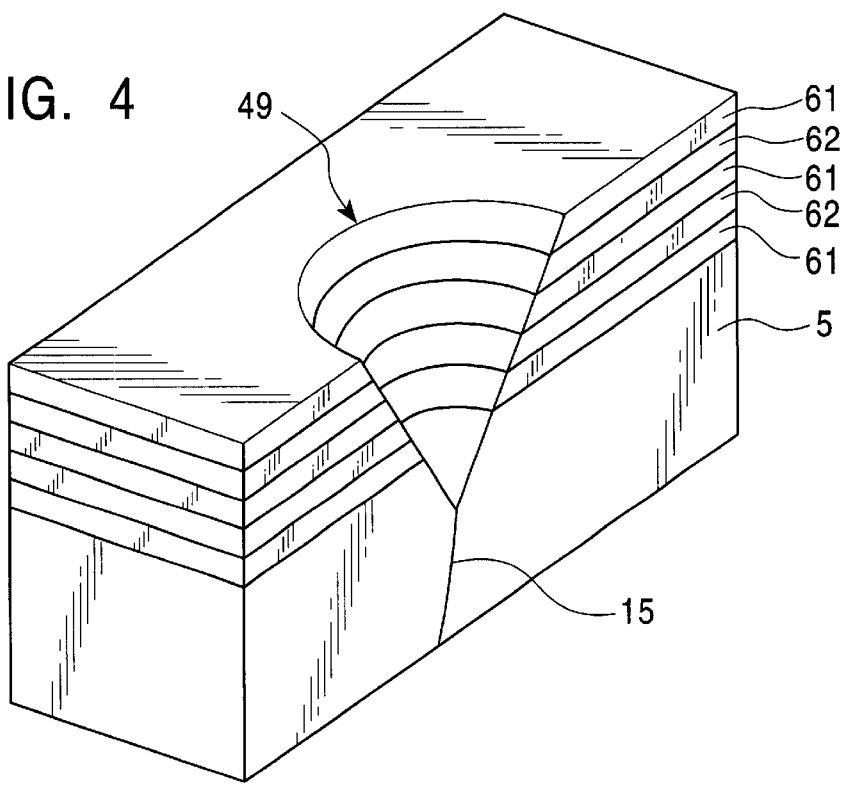
FIG. 4 is a schematically fragmentary, perspective view showing a substrate in the manufacturing process of semiconductor laser devices according to an embodiment of the present invention.

FIG. 4 shows the substrate after it has been subjected to the etching in the hot phosphoric acid solution. Since GaN is chemically stable, it is substantially impervious to etching even in the hot phosphoric acid solution. However, a proximate portion to the dislocation can be slightly etched to produce a pit 49. When the bottom of the pit the reaches the lower boundary of the active layer, then the pit has the most suitable depth. Thus, the most etching process should be terminated at the point of time when the erosion along the threading dislocation is reaches the lower guide layer 5. The active layer is supposed to have a plurality of pits 49, each of which has a shape of inverted cone or truncated cone. When the pits become close, they form a recess of continuous shape.

After the etching process, the substrate is adequately rinsed with pure water, ultrasonically-cleaned with organic solvents, and then is again loaded into the MOCVD reactor.

Then, the substrate is again heated to 1050° C. while $NH_3$ and hydrogen as a carrier gas are flowing. TMG, TMA, and ethyl-cyclopentadienyl magnesium (Et-Cp$_2$Mg) as a precursor for p-type dopant are introduced to grow a p-type AlGaN layer 7, thereby forming a barrier layer with a thickness of 0.02 $\mu$m.

Referring to FIG. 2, at a point of time when the growth of the p-type AlGaN barrier layer 7 is finished, the pits (recesses) formed by the etching have been filled with the p-type AlGaN. This is because both of the high temperature of 1050° C. and the nature of AlGaN (material) promote the surface flattening of the barrier layer 7. Once the smooth surface of the barrier layer is established, the individual layer to be formed above the barrier layer 7 can be formed with a flat surface. Thus, the barrier portion 51 is formed to have a conical or truncated-conical shape. It should be noted that though only one barrier portion 51 is shown in FIG. 2, the multi-layer structure may have a plurality of barrier portions, which may be contiguous to one another depending on the configuration of pits.

Subsequently, supply of TMA is stopped, and a p-type GaN layer 8 is grown on the barrier layer 7 to have a thickness of 0.5 $\mu$m. TMA is then introduced again so that a p-type AlGaN clad layer 9 is grown thereon to have a thickness of 0.5 $\mu$m. Further, a p-type GaN contact layer 10 is grown on the layer 9 to have a thickness of 0.1 $\mu$m. Thereafter, supply of TMG and Et-Cp$_2$Mg is stopped, and cooling is started. At a point of time when the substrate is cooled to 400° C., supply of NH$_3$ is also stopped. At a point of time when the substrate is cooled to a room temperature, the substrate with multi-layer structure is unloaded from the reactor. The substrate with multi-layer structure of the first embodiment is referred hereinafter to as a wafer 1.

For the purposes of comparison, a wafer was prepared in the same manner as in the above-described growth method except an absence of the above etching process. The wafer intended for the comparison is referred hereinafter to as a wafer 2. More specifically, the wafer 2 was processed in the following manner. After the growth of the last barrier layer 61, the carrier gas was switched over from nitrogen to hydrogen at 750° C. in without unloading the substrate from the reactor. The substrate was simultaneously heated to 1050° C., and the p-type AlGaN layer 7 and the following respective layers were grown without interruption.

The wafer 1 and the wafer 2 were subjected to a heat treatment in the furnace to acquire p-type condition at a temperature of 800° C. for 20 minutes in nitrogen gas at atmospheric pressure.

Formed on each of the resultant wafers 1 and 2 were a terrace for the p-type electrode, a current path for the n-type electrode, and a narrow ridge structure on the terrace for the a refractive index wave guiding and for current constriction.

The narrower ridge structure was formed on the substrate by using standard photolithography and reactive ion-etching (RIE) to remove portions except the 5 $\mu$m wide ridge leaving the p-type AlGaN cladding layer 9 with a thickness of about 0.1 $\mu$m. Likewise, RIE was then used to remove unnecessary portions including the p-type layers exposing the n-type GaN base layer 3 partially.

After removal of the etching mask, an SiO$_2$ protective layer was deposited by means of a sputtering method or the like. A window having a width of 3 $\mu$m was formed in the SiO$_2$ protective film on the p-type ridge portion. A window for n-type electrode was formed in the SiO$_2$ protective film on the exposed portion of the n-type layer.

An n-type electrode 14 was formed on the region on which the n-type GaN layer 3 was exposed, by depositing Ti (titanium) to a thickness of 50 nm and subsequently Al (aluminum) to 200 nm. The p-type electrode 13 was formed in the region, where the p-type GaN layer was exposed, by evaporating Ni (nickel) and Au (gold) with thickness of 50 mm and 200 nm, respectively.

The wafer processed in this manner was cleaved to form a device shown in FIG. 1. Thereafter, the characteristics of the respective devices were measured. The measurement was performed with pulses having a width of 0.5 $\mu$sec and a duty ratio of 0.02%.

Figure 5:
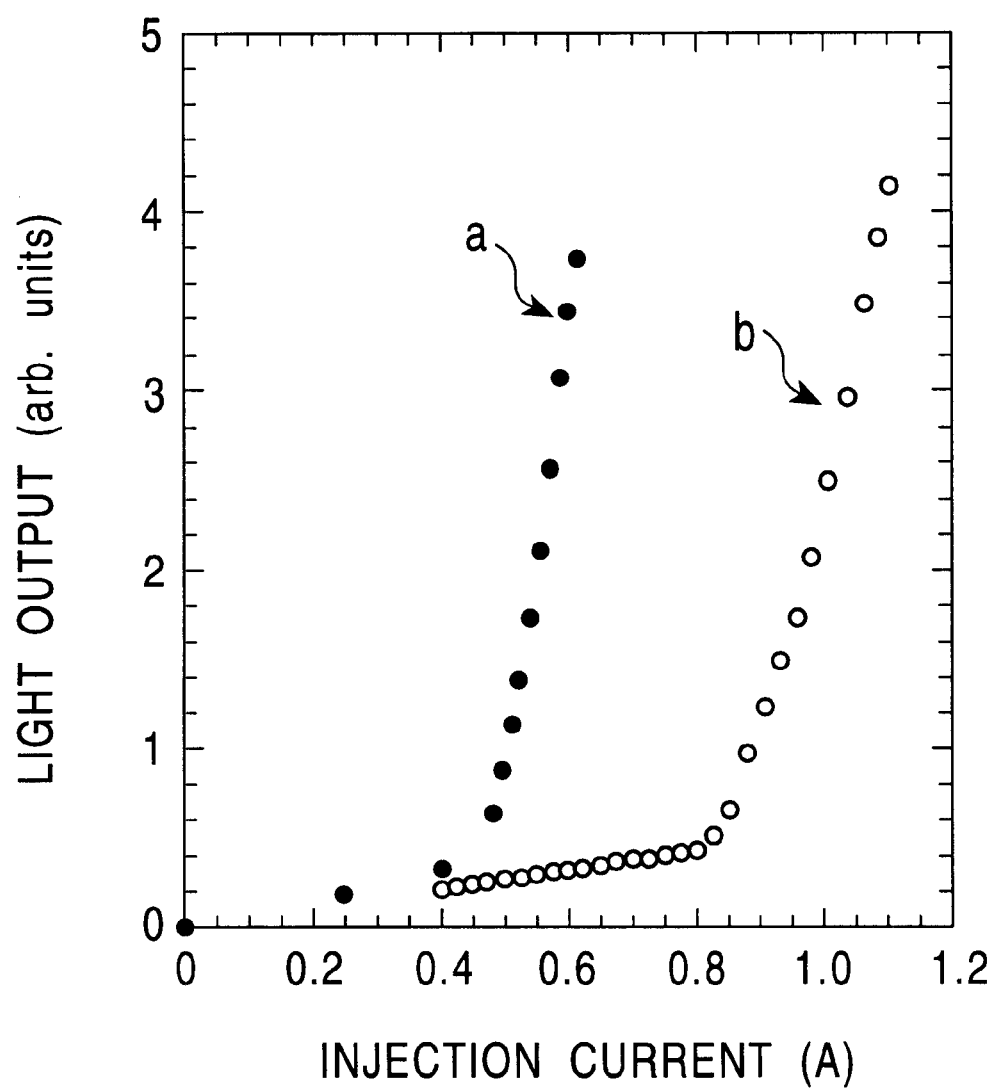
FIG. 5 is a graph showing current/light output characteristics of a semiconductor laser device according to an embodiment of the present invention.

Referring to FIG. 5, the points represented by • indicate current/light output characteristic of a laser device according to the embodiment of the invention, which was formed from the wafer 1. The device oscillated with a threshold current of about 430 mA at a wavelength of 405 nm. The points represented by ○in FIG. 5 represent current/light output characteristic of a device formed from the wafer 2, i.e. the comparative example. The device oscillated with a threshold current of about 800 mA at a wavelength of 410 nm.

The threshold current of the device according to the embodiment of the present invention is to about ½ of that of the comparative sample showing the remarkable improvement in the device characteristics.

In an active layer like the present embodiment, injected electrons and holes are mainly collected by the well layers 62 of smaller bandgap in the case of the present embodiment, those carriers are blocked by the AlGaN barrier portion 51 of the same material as that of the barrier layer 7 and having a larger bandgap, so that they cannot reach the threading dislocations 15. As a result, the threading virtually do not act as non-radiative recombination centers. Whereas in the case of the comparative device injected carriers can freely reach the threading dislocations, so that the threading dislocations can act as efficient non-radiative recombination centers to degrade the light emitting characteristics.

In an alternative embodiment, the etching process can be performed in the film forming apparatus. In this case, vapor etching is performed. HCl (hydrogen chloride) can be used as an etching gas. Also, re-evaporation of InGaN layer may be utilized with increasing of hydrogen flow in the carrier gas while decreasing NH$_3$ flow rate as compared with that of the normal growth condition. However, these methods are not so effective as that of the above described embodiment.

While the above embodiment adopts an etching as the method for forming the pits around the threading dislocations in the active layer, a second embodiment adopts a method of forming the pits in-situ around threading dislocations in the active layer. That is, the second embodiment utilizes the fact that crystal growth can be inhibited near a threading disclocation under particular growth conditions.

Like the first embodiment, the n-type GaN layer 4 and the n-type GaN guide layer 5 were grown on the sapphire substrate 1.

Figure 6:
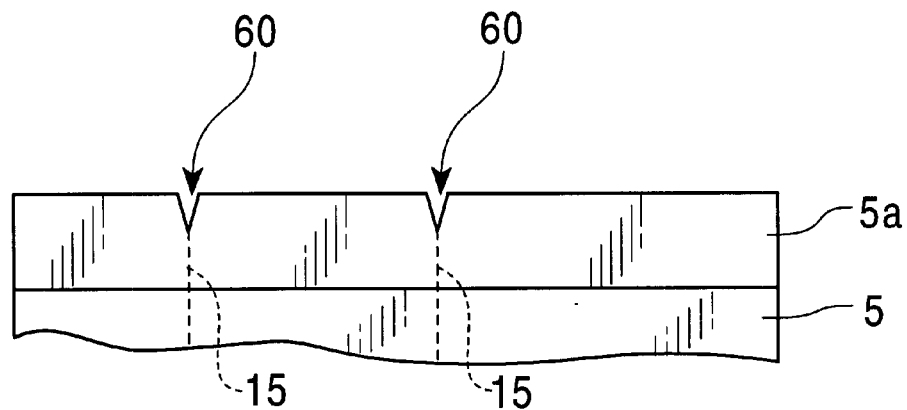
FIG. 6 is a schematic, cross sectional view showing a substrate in the manufacturing process of semiconductor laser devices according to a second embodiment of the present invention.

Then, the wafer was cooled to a temperature in the range of 600 to 850° C., for example 770° C. After a switching of the carrier gas from hydrogen to nitrogen a pit generating layer 5a of n-type InGaN doped with Si was grown to a thickness of 400 Å as shown in FIG. 6 with TMI, TMG, ammonia, and methylsilane as the precursors. During this process, portions 60 where the growth is inhibited were initiated in situ. In addition, material of the pit generating layer 5a is not limited to InGaN but may be a material such an GaN, AlGaN, or the like having a bandgap equal to or greater than that of the active layer. Also, non-doped material may be used. Generated at 600° C. or less, however which is not preferable because of the degradation of layer quality. Further, to establish the growth inhibitition of the portion 60 around the threading disclocation(s), the pit generating layer 5a is required to have a thickness of 100 Å or more, and preferably about 200 Å. However, because of the low growth temperature, the layer quality becomes somewhat degraded as compared with the normal crystal layer formed at 1050° C. Also, a pit generating layer 5a with an excessive thickness might increase waveguide loss.

Figure 7:
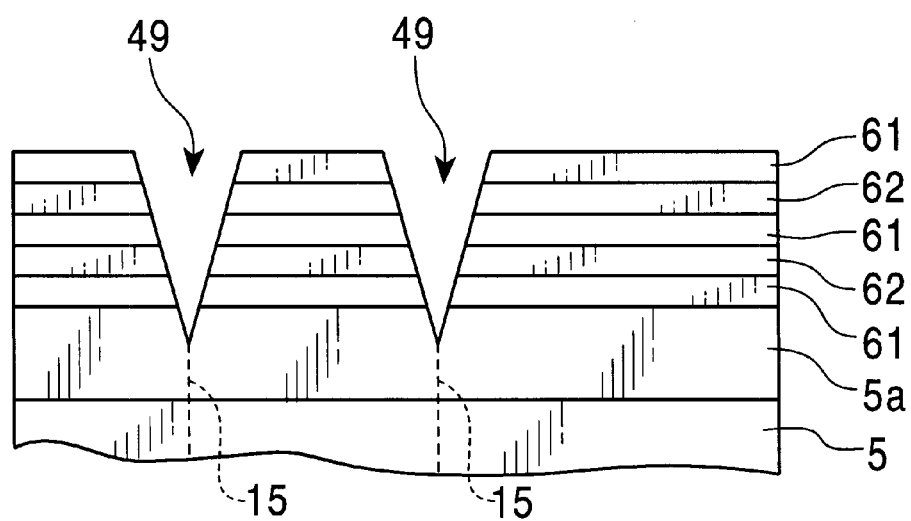
FIG. 7 is a schematic, cross sectional view showing a substrate in the manufacturing process of semiconductor laser devices according to the second embodiment of the present invention.

Subsequently, an active layer 6 was formed on the pit generating layer 5a at 770° C. First, a barrier layer 61 was formed from TMI, TMG, ammonia and methylsilane as precursors, and a well layer 62 was then formed while the feed of methylsilane was stopped and a flow rate of TMI was increased. This process was repeated a predetermined number of times to grow a MQW active layer 6 as shown in FIG. 7. In this manner, prior to the formation of the active layer 6, the pit generating layer 5a was formed in a temperature range of 600–850° C., and pits 49 were formed during the growth of the active layer 6. It should be noted that the active layer is not limited to MQW.

Figure 8:
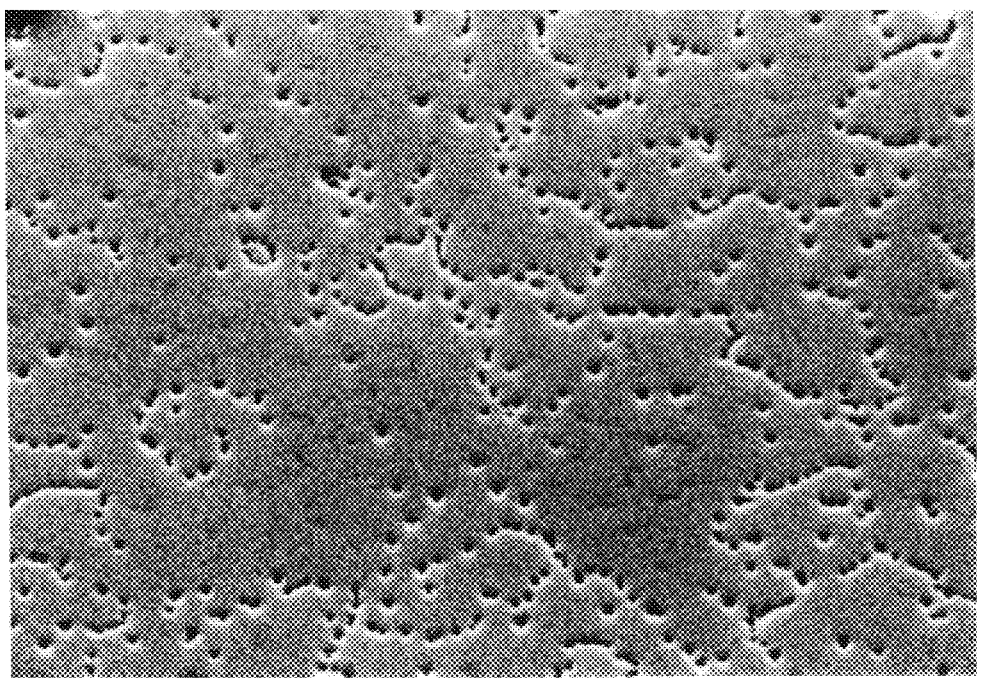
FIG. 8 is an electron microscope photograph, of a surface of a wafer in the manufacturing process of semiconductor laser devices according to the second embodiment of the present invention.

FIG. 8 shows an electron microscope photograph of a wafer with the active layer inclined at 45 degrees. The density of pits is estimated to be $5 \times 10^9/cm^2$, which is substantially equal to the density of threading dislocations in the film.

For the purpose of comparision, a wafer was also formed in the same manner as in the second embodiment except that the low temperature pit generating layer 5a, was not formed.

Figure 9:
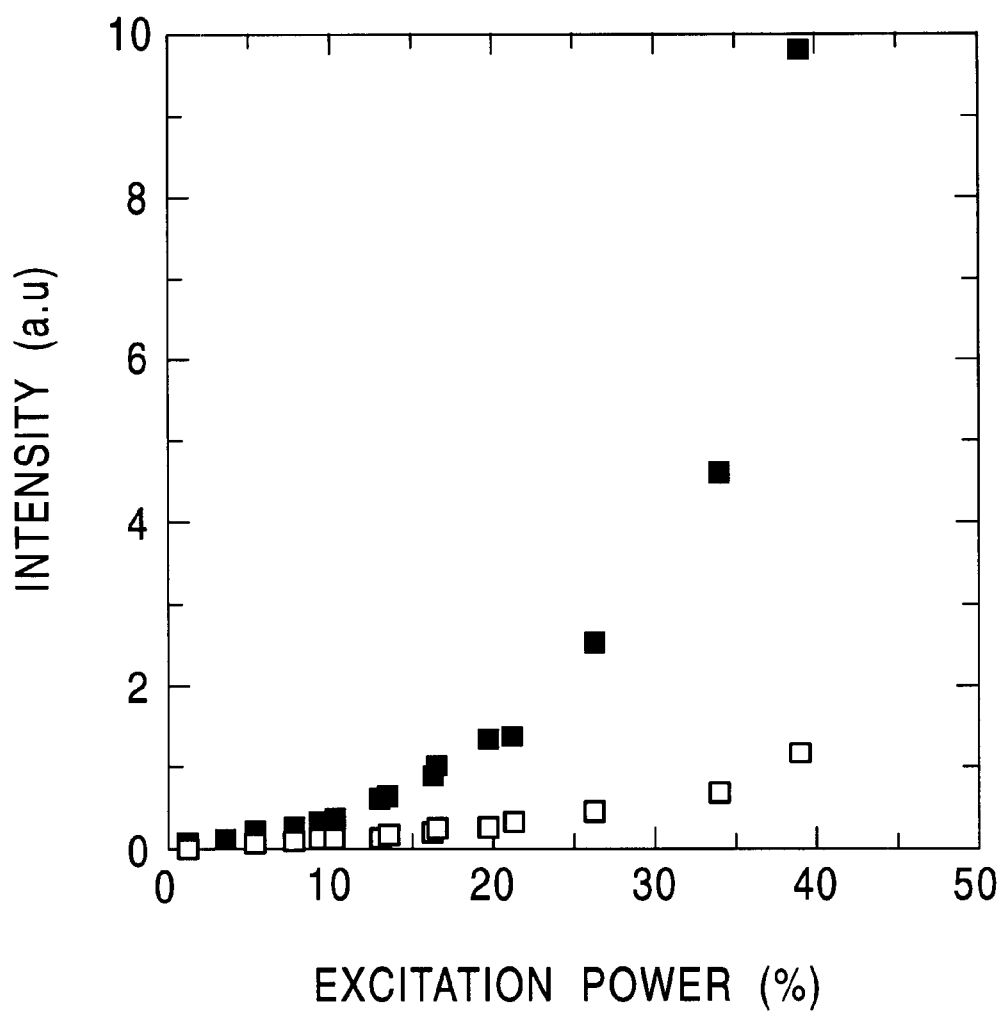
FIG. 9 is a graph showing an excitation power dependence of emitted light intensity with respect to a wafer in the manufacturing process of semiconductor laser devices according to a further embodiment of the present invention.

To compare the light emitting characteristics of the second embodiment with that of the comparative example, excitation power dependence of the emitted light intensity of the MQW active layer 6 in the wafer was measured. FIG. 9 is a graph showing the results of the measurements with respect to the excitation power dependence of the emission intensity of the wafers in the second embodiment and the comparative example. A nitrogen laser with a wavelength of 337.1 nm was used as the excitation source. A horizontal axis of the graph indicates the excitation laser power in percentage to the maximum output. The point denoted by ■ represents the emission intensity of the sample according to the second embodiment, and the point denoted by □ represents the data of the comparative sample It was found that the second embodiment (■) is five to ten times superior in light within this intensity to the comparative sample (□) within this measurement range.

The above-described first and second embodiments are characterized by the pit forming process in which recesses are formed on the threading dislocations in the semiconductor layer disposed under the active layer. Another important point in applying the present invention to light emitting devices is to fill the pits 49 shown in FIGS. 4 and 7 with AlGaN to smooth the surface thereof when the barrier layers 7 of $Al_xGa_{1-x}N$ is formed. In this regard, a third embodiment will be described, which is applied to the above first and second embodiments with respect to the process of forming the barrier portions.

A temperature of 1000° C. or higher is required in the process for getting an adequate flat surface. During the rising to this growth temperature, re-evaporation of the constituent the active layer 6 (the well layers 62 and the barrier layers 61) tends to occur. Thus, in particular, the outmost barrier layer 61 in the multiple quantum wells tends to deteriorate.

At the time when the formation of the active layer 6 (that is, the well layers 62 and the barrier layers 61) of InGaN is completed, a low temperature AlGaN barrier layer 71 starts to be grown. The low temperature AlGaN barrier layer 71 is a film constituting a part of the AlGaN barrier layer 7. The low temperature AlGaN barrier layer 71 is disposed utilizing the fact that AlN has much higher thermal stability as compared with GaN in the growth ambience. The re-evaporation described above can be effectively prevented by depositing a minute layer of low temperature AlGaN having an AlN composition ratio of about 0.2. The low temperature AlGaN barrier layer 71 preferably has a thickness corresponding to several mono-layers, that is, about 20 Å. Excessive thickness of this layer would deteriorate hole injection into the active layer from the p-type layer. Thus the thickness is preferably less than 100 Å.

When the structure of the third embodiment is applied to that of the first embodiment to form a light emitting device, a wafer is unloaded from the reactor, and etched to form pits 49 in the active layer 6, after that or thereafter a low temperature AlGaN barrier layer 71 is grown.

When the structure of the third embodiment is applied to that of the second embodiment to form a light emitting device, a low temperature AlGaN barrier layer 71 is grown immediately after forming the active layer 6 without changing the substrate temperature. Thereafter, the carrier gas is switched from nitrogen to hydrogen, the substrate is heated to 1050° C. for the subsequent film formation.

In either of the above cases, the AlGaN barrier layer 7 is grown in the hydrogen carrier gas after increasing the temperature to 1050° C.

Figure 10:
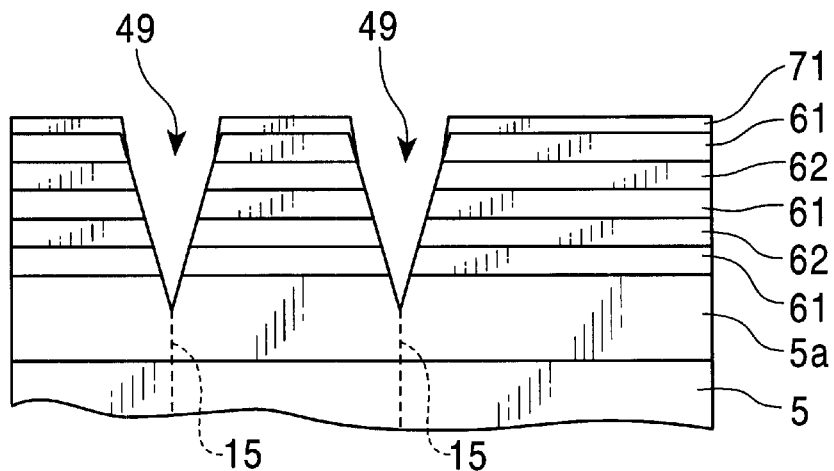
FIG. 10 is a schematic, cross sectional view showing an active layer of a group 3 nitride semiconductor laser device according to a third embodiment of the present invention.
Figure 11:
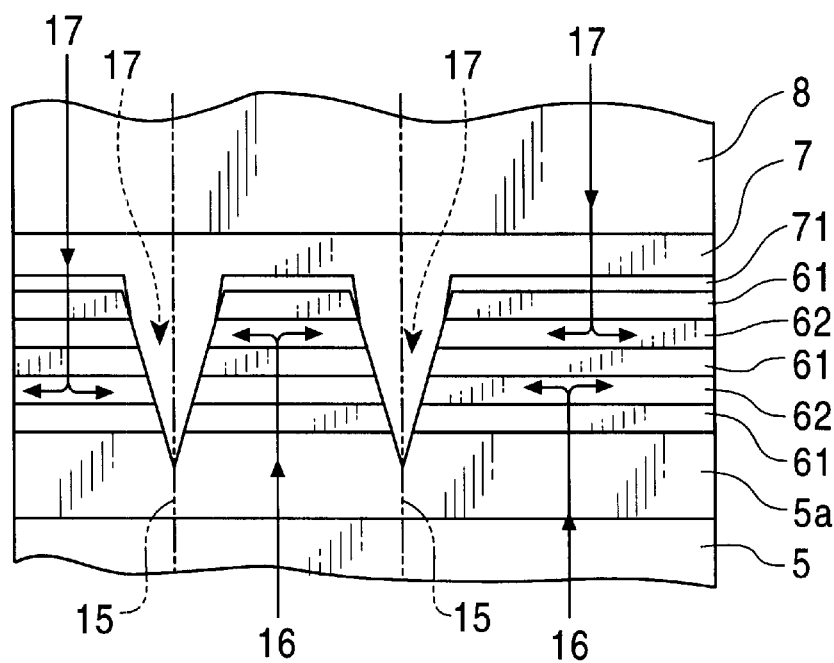
FIG. 11 is a schematic, cross sectional view showing a substrate in the manufacturing process of semiconductor laser devices according to the third embodiment of the present invention.

With the third embodiment, the pits 49 are hardly filled up because of the low growth temperature of AlGaN barrier layer 71. FIG. 10 depicts such situation.

In the light emitting device according to the third embodiment, the low temperature AlGaN barrier layer 71 has a lower composition ratio of AlN than that of the AlGaN barrier layer 7. If, if the low temperature AlGaN barrier layer 71 has a higher composition ratio of AlN than that of the AlGaN barrier layer 7, holes 17 injected from the p-type guide layer (shown by the dotted lines) would tend to be injected into the barrier portions 51 of the AlGaN barrier layer 7 which has a smaller composition ratio of AlN (or a smaller bandgap).

By setting the AlN composition ratio of the low temperature AlGaN barrier layer 71 to be less than that of the AlGaN barrier layer 7, the holes 17 (shown by solid lines) injected from the p-type guide layer are blocked by the barrier portions 51 as well as electrons 16 injected from the n-type GaN layer, thereby not reaching the threading dislocations 15.

Accordingly, when the structure of the third embodiment is applied to that of the second embodiment to form a light emitting device, after the growth of the active layer, a low temperature AlGaN barrier layer 71 is formed at substantially the same temperature as that of the growth temperature of the active layer. A second AlGaN barrier layer 7 is then formed after the temperature increase. Also, in applying the structure of the third embodiment to any one of the above embodiments, the AlGaN barrier layer 7 is set to have a larger composition ratio of AlN than that of the low temperature AlGaN barrier layer 71.

While the first to third embodiments have been described with respect to laser devices, the present invention can provide similar effects in the case of being applied to formation of LEDs (light emitting diodes).

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

What is claimed is:

1. A nitride semiconductor light emitting device comprising:

an active layer comprising group-3 nitride semiconductors, a barrier layer made from a predetermined material and provided adjacent to said active layer, said barrier layer having a greater bandgap than that of said active layer, and a barrier portion formed of said predetermined material for surrounding a threading dislocation in said active layer, said barrier portion being defined by interfaces enclosing said threading dislocation.

2. A nitride semiconductor light emitting device according to claim 1, wherein said active layer has one of a single and multiple quantum well structure.

3. A nitride semiconductor light emitting device according to claim 1, wherein said predetermined material of said barrier layer fills up a recess enclosed with said interfaces on said active layer to smooth surfaces of said recess.

4. A nitride semiconductor light emitting device according to claim 1, wherein said barrier portion has one of a cone-shape, truncated cone shape and a combination thereof.

5. A nitride semiconductor light emitting device according to claim 1, wherein said group-3 nitride semiconductor single-crystal layers are $(Al_xGa_{1-x})_{1-y}In_yN$ ($0 \leq x \leq 1$, $0 \leq y \leq 1$).

6. A nitride semiconductor light emitting device according to claim 5, further comprising a low temperature barrier layer provided between said barrier layer and said active layer, said low temperature barrier layer being formed of substantially the same predetermined material as that of said barrier layer at substantially the same temperature as the growth temperature of said active layer.

7. A nitride semiconductor light emitting device according to claim 6, wherein said low temperature barrier layer has a composition ratio of AlN which is less than a composition ratio of said barrier layer.

* * * * *